United States Patent
Kopaczewski et al.

(10) Patent No.: US 10,916,929 B2
(45) Date of Patent: Feb. 9, 2021

(54) CIRCUIT BREAKER AND METHOD FOR EMITTING A WARNING UPON A THRESHOLD BEING EXCEEDED

(71) Applicant: Siemens Aktiengesellschaft, Munich (DE)

(72) Inventors: Peter Kopaczewski, Berlin (DE); Andre Borgwardt, Schoenwalde-OT Paaren (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 322 days.

(21) Appl. No.: 16/108,362

(22) Filed: Aug. 22, 2018

(65) Prior Publication Data
US 2019/0067929 A1    Feb. 28, 2019

(30) Foreign Application Priority Data
Aug. 25, 2017    (DE) .......... 10 2017 214 903

(51) Int. Cl.
*H02H 1/06*    (2006.01)
*G01R 31/42*    (2006.01)
(Continued)

(52) U.S. Cl.
CPC .......... *H02H 1/06* (2013.01); *G01R 31/3275* (2013.01); *G01R 31/42* (2013.01); *H02H 3/08* (2013.01);
(Continued)

(58) Field of Classification Search
CPC .......... H02H 1/06; H02H 3/044; H02H 3/093; H02H 3/087; G01R 31/3274; G01R 31/3275
See application file for complete search history.

(56) References Cited

U.S. PATENT DOCUMENTS

2002/0191361 A1    12/2002    Houbre
2007/0165342 A1*    7/2007    Elms .................. H02H 3/05
                                                      361/42
(Continued)

FOREIGN PATENT DOCUMENTS

DE           60200500 T2      8/2005
DE        102009040692 A1     3/2011
(Continued)

*Primary Examiner* — Harry R Behm
(74) *Attorney, Agent, or Firm* — Harness, Dickey & Pierce, P.L.C.

(57) ABSTRACT

A circuit breaker, for interrupting an electrical circuit including electrical conductors, includes an energy converter, a primary side being formed by a conductor and a secondary side being connected to a power supply; a sensor for determining the level of the electric current of an electrical conductor; and a controller, connected to the power supply and the sensor, to cause an interruption of the electrical circuit when current limit values or current/time period limit values are exceeded. The secondary side of the energy converter is connected to the input of a measurement circuit, the output of the energy converter being connected to the controller. The measurement circuit determines an amount of energy and delivers this to the controller, the controller comparing the amount of energy with the level of the current determined by the sensor and emitting a warning signal when a first threshold value is exceeded.

23 Claims, 3 Drawing Sheets

(51) Int. Cl.
*H02H 3/08* (2006.01)
*H02H 3/093* (2006.01)
*H02H 3/44* (2006.01)
*G01R 31/327* (2006.01)

(52) U.S. Cl.
CPC ............ *H02H 3/083* (2013.01); *H02H 3/093* (2013.01); *H02H 3/44* (2013.01)

(56) References Cited

U.S. PATENT DOCUMENTS

| | | |
|---|---|---|
| 2011/0058300 A1 | 3/2011 | Krauss et al. |
| 2013/0021710 A1 | 1/2013 | Driehorn et al. |
| 2013/0329331 A1* | 12/2013 | Erger ................... H01H 9/168 361/102 |
| 2016/0126717 A1* | 5/2016 | Valdes ................... H02H 7/30 361/93.1 |
| 2016/0141862 A1* | 5/2016 | Endozo ................. H02H 3/044 361/115 |
| 2017/0046458 A1* | 2/2017 | Meagher ............. H02J 13/0006 |

FOREIGN PATENT DOCUMENTS

| | | |
|---|---|---|
| DE | 102011079461 A1 | 1/2013 |
| WO | WO 9400862 A1 | 1/1994 |

* cited by examiner

CIRCUIT BREAKER AND METHOD FOR EMITTING A WARNING UPON A THRESHOLD BEING EXCEEDED

PRIORITY STATEMENT

The present application hereby claims priority under 35 U.S.C. § 119 to German patent application number DE 102017214903.5 filed Aug. 25, 2017, the entire contents of which are hereby incorporated herein by reference.

FIELD

At least one embodiment of the invention generally relates to a circuit breaker for interrupting an electrical circuit having electrical conductors and/or a method.

BACKGROUND

Circuit breakers are protection devices, which function in a similar way to a fuse. Circuit breakers monitor the current flowing through them via a conductor and interrupt the electric current or flow of energy to an energy sink or a load, which is referred to as tripping, when protection parameters, such as current limit values or current/time period limit values, that is to say when a current value is present for a certain time period, are exceeded. The set current limit values or current/time period limit values are corresponding reasons for tripping. Interruption is performed, for example, by contacts of the circuit breaker, which are opened.

Particularly for low-voltage electrical circuits or supply systems, there are various types of circuit breakers, depending on the level of the provided electric current in the electrical circuit. Within the meaning of embodiments of the invention, circuit breaker means, in particular, switches as are used in low-voltage installations for currents of from 63 to 6300 amperes. Molded case circuit breakers are especially used for currents of from 63 to 1600 amperes, in particular of from 125 to 630 or 1200 amperes. Air circuit breakers are used, in particular, for currents of from 630 to 6300 amperes, especially of from 1200 to 6300 amperes.

Air circuit breakers are also termed ACB for short and molded case circuit breakers are termed MCCB for short.

Low voltage means, in particular, voltages up to 1000 volts AC or 1500 volts DC. Low voltage especially means, in particular, voltages greater than extra-low voltage, with values of 25 volts or 50 volts AC and 60 volts or 120 volts DC.

Within the meaning of the present application, circuit breaker means, in particular, circuit breakers with an electronic trip unit, ETU for short, which serve as control unit.

In the case of too high a flow of current, circuit breakers interrupt the circuit in accordance with the protection parameters or response values of the circuit breakers. The protection parameters or response values are essentially the level of the current and the time after which the circuit is intended to be interrupted in the case of a constantly "high" flow of current. In contrast to a fuse, these protection parameters or response values for a circuit breaker can be set, for example via the electronic trip unit. The electronic trip unit is usually mounted over the front of the circuit breaker in an accessible manner. The protection parameters can be set or parameterized by way of this.

In modern circuit breakers, the focus is on energy efficiency, in particular. Furthermore, the present low-voltage circuits change to the effect that an increased harmonic component is present in the low-voltage supply system, in particular as a result of converters that are present. In the meantime, the voltage and the current, respectively, do not have a frequency of 50 Hz and a lot of energy is contained in relatively high frequencies.

SUMMARY

The inventors have recognized that this leads to the problem that the present energy converters in a circuit breaker for supplying energy to the circuit breaker deliver less energy depending on the supply system present.

Relatively large converters could deliver more energy but the circuit breakers will then become larger, which is not desired. Newer energy converters deliver significantly less energy for the energy supply to the circuit breaker, in particular for the electronic trip unit or control unit, respectively, in comparison with the previously used, frequency-sensitive energy converters, in particular for relatively high frequencies or/and in particular in the low primary-current range.

The inventors have further recognized that there is also the problem that a failure or deteriorated functioning of the energy converter has not been able to be detected until now.

The inventors have further recognized that this creates a problem in the supply of energy to a circuit breaker.

At least one embodiment of the present invention is directed to an improved circuit breaker, in particular to provide a statement regarding the correct function of an energy converter.

Embodiments of the present invention is directed to a circuit breaker and/or a method.

At least one embodiment of the present invention provides a circuit breaker for interrupting an electrical circuit having electrical conductors, comprising:

an energy converter for supplying energy to the circuit breaker, the primary side of which energy converter is formed by a conductor or a part of a conductor in such a way that the current of the conductor or at least a partial current forms the primary current of the energy converter, and the secondary side of which energy converter is connected to a power supply unit;

a sensor unit for determining the level of the electric current of a conductor of the electrical circuit; and a control unit of the circuit breaker, which control unit is connected to the power supply unit and the sensor unit and is designed in such a way that an interruption of the electric circuit is caused when current limit values or current/time period limit values are exceeded, wherein the secondary side of the energy converter is connected to the input of a measurement circuit, the output of which energy converter is connected to the control unit, wherein the measurement circuit is designed in such a way that it determines an amount of energy and delivers this to the control unit, and wherein the control unit is designed in such a way that the amount of energy is compared with the level of the current determined by the sensor unit, for example by forming the difference, and a warning signal is emitted when a first threshold value, for example difference threshold value, is exceeded.

At least one embodiment of the present invention provides a method for a circuit breaker including an energy converter, a sensor unit to determine current of at least one conductor passing through the circuit breaker, and a control unit, the method comprising:

determining, on the secondary side, an amount of energy via the energy converter;

comparing the amount of energy determined with a level of current determined via the sensor unit; and emitting a warning signal upon the comparing yielding a difference exceeding a first threshold value.

BRIEF DESCRIPTION OF THE DRAWINGS

The described properties, features and advantages of embodiments of the invention and the manner in which they are achieved become more clearly and distinctly comprehensible in conjunction with the following description of the example embodiments, which are explained in more detail in connection with the drawing.

Here, in the drawings.

DETAILED DESCRIPTION OF THE EXAMPLE EMBODIMENTS

Figure 1:
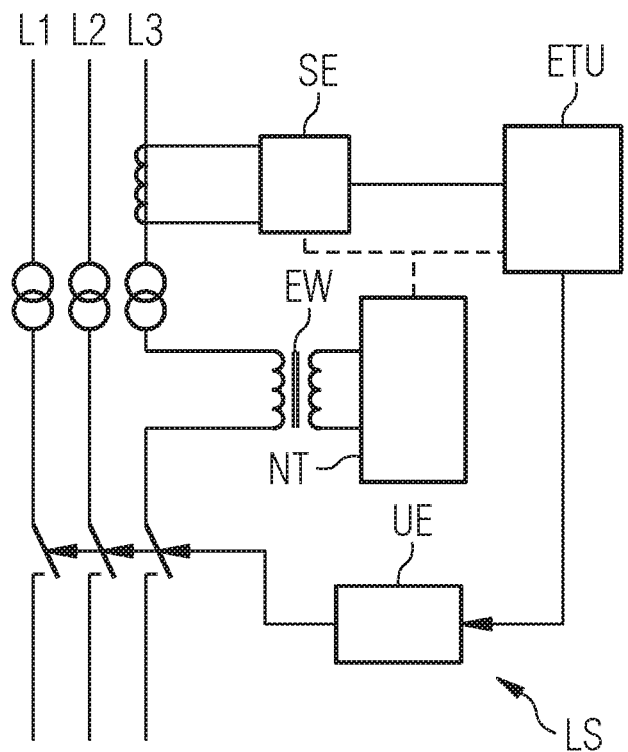
FIG. 1 shows a first illustration for explanation of an embodiment of the invention.

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment of the present invention provides a circuit breaker for interrupting an electrical circuit having electrical conductors, comprising:

an energy converter for supplying energy to the circuit breaker, the primary side of which energy converter is formed by a conductor or a part of a conductor in such a way that the current of the conductor or at least a partial current forms the primary current of the energy converter, and the secondary side of which energy converter is connected to a power supply unit;

a sensor unit for determining the level of the electric current of a conductor of the electrical circuit; and a control unit of the circuit breaker, which control unit is connected to the power supply unit and the sensor unit and is designed in such a way that an interruption of the electric circuit is caused when current limit values or current/time period limit values are exceeded, wherein the secondary side of the energy converter is connected to the input of a measurement circuit, the output of which energy converter is connected to the control unit, wherein the measurement circuit is designed in such a way that it determines an amount of energy and delivers this to the control unit, and wherein the control unit is designed in such a way that the amount of energy is compared with the level of the current determined by the sensor unit, for example by forming the difference, and a warning signal is emitted when a first threshold value, for example difference threshold value, is exceeded.

In at least one embodiment, this has the particular advantage that a statement can be made regarding the effective functioning of an energy converter. A warning signal is emitted in the case of ineffective functioning of the energy converter or even the failure thereof.

This is achieved in accordance with at least one embodiment of the invention by virtue of the fact that the current level determined by the sensor is compared with the secondary energy output of the energy converter. In the case of a difference that exceeds the first threshold value, a piece of information, for example in the form of a warning signal, is emitted.

Advantageous configurations of embodiments of the invention are specified in the claims.

In an advantageous configuration of at least one embodiment of the invention, one sensor unit, one energy converter and one measurement circuit is provided for each conductor of the circuit breaker, for example advantageously in a three-phase AC circuit, for example advantageously in the case of a 3-pole or 4-pole circuit breaker. The control unit is designed in such a way that, for each conductor, the amount of energy is compared with the level of the determined current and a warning signal is emitted when the first threshold value is exceeded.

This has the particular advantage that monitoring is carried out for each conductor or for each energy converter. The energy contribution of each individual energy converter in a circuit breaker can thus be monitored. A warning signal can be emitted overall or/and for each conductor or energy converter.

In an advantageous configuration of at least one embodiment of the invention, the energy converter is an iron core converter or a converter with a nanocrystalline core.

This has the particular advantage that individually adapted energy converters can be used for specific low-voltage supply systems.

In an advantageous configuration of at least one embodiment of the invention, the sensor unit has a Rogowski coil.

This has the particular advantage that a particularly simple and precise determination of the level of the electric current of a conductor is provided.

In an advantageous configuration of at least one embodiment of the invention, the power supply unit has a rectifier circuit, followed by a voltage limitation circuit, followed by a buffer capacitor.

This has the particular advantage that a particularly simple realization for a power supply unit is provided.

In an advantageous configuration of at least one embodiment of the invention, the buffer capacitor on one side provides the supply voltage for the control unit and on the other side provides an input voltage for the voltage limitation circuit.

This has the particular advantage that simple control of the supply voltage is provided.

In one advantageous configuration of at least one embodiment of the invention, the voltage limitation circuit has at least one transistor, in particular a short-circuiting transistor.

This has the particular advantage that a simple possibility for voltage limitation is provided.

In one advantageous configuration of at least one embodiment of the invention, in the measurement circuit, the first input connection is connected to the second input connection by a series circuit of a first resistor, a first diode and a parallel circuit, wherein the parallel circuit has a second resistor, a capacitor and at least two input connections of an analog-to-digital converter. At least two output connections of the analog-to-digital converter are connected as output connections of the measurement circuit to the control unit.

This has the particular advantage that a simple and cost-effective measurement circuit is provided for implementing at least one embodiment of the invention.

In an advantageous configuration of at least one embodiment of the invention, the parallel circuit has a second diode, in particular a Zener diode.

This has the particular advantage that voltage limitation for the case of overvoltages is provided for the protection of the analog-to-digital converter.

In an advantageous configuration of at least one embodiment of the invention, a microprocessor is connected downstream of the analog-to-digital converter.

This has the particular advantage that preprocessing or determination or adaptation of the amount of energy is made possible as early as in the measurement circuit.

In an advantageous configuration of at least one embodiment of the invention, the energy converter and at least a part of the sensor unit are arranged in a common housing.

This has the particular advantage that a particularly compact realization is made possible.

A method according to at least one embodiment of the invention with advantageous configurations is also advantageously claimed analogously.

All of the configurations and embodiments, including those set forth in the patent claims, and with reference back to just single features or combinations of features of patent claims, bring about an improvement in a circuit breaker.

FIG. 1 shows an illustration for explanation of an embodiment of the invention, which shows a part of a circuit breaker LS, wherein different units of a circuit breaker are illustrated. FIG. 1 shows electrical conductors L1, L2, L3 of an electrical circuit, for example a three-phase AC circuit, wherein the first conductor L1 forms the first phase, the second conductor L2 forms the second phase and the third conductor L3 forms the third phase of the three-phase AC circuit. A neutral conductor and a protective conductor can also be provided.

In the example in accordance with FIG. 1, the third conductor L3 is connected to the energy converter EW in such a way that at least a portion of the current, that is to say a partial conductor current, or the entire current of the third conductor flows through the primary side of the energy converter EW. The energy converter EW is usually a transformer with a core. In one configuration, an energy converter EW can be provided in each phase or in each conductor of the electrical circuit. The secondary side of the energy converter EW or each provided energy converter is connected to a power supply unit NT (or a plurality of power supply units), which provides an energy supply, for example in the form of a supply voltage, for the control unit ETU. The power supply unit NT can also be connected to a sensor unit SE for supplying energy to the sensor unit—if necessary.

The sensor unit SE has at least one sensor element, for example a Rogowski coil, for determining the level of the electric current of at least one conductor of the electrical circuit. In a conventional design variant, the level of the electric current of each phase conductor or conductor of the electrical circuit is determined.

The sensor unit SE is connected to the control unit ETU and transmits the level of the electric current of at least one conductor, the phase conductors or all of the conductors of the electrical circuit to the control unit.

The control unit ETU can be an electronic trip unit.

The transmitted current values are compared in the control unit ETU with current limit values or/and current/time period limit values, which form reasons for tripping. If the limit values are exceeded, an interruption of the electrical circuit is caused. This may be realized, for example, by virtue of the provision of an interruption unit UE, which is connected on one side to the control unit ETU and on the other side has contacts for interrupting the conductors L1, L2, L3 or further conductors of the electrical circuit. The interruption unit UE in this case receives an interruption signal for opening the contacts.

Figure 2:
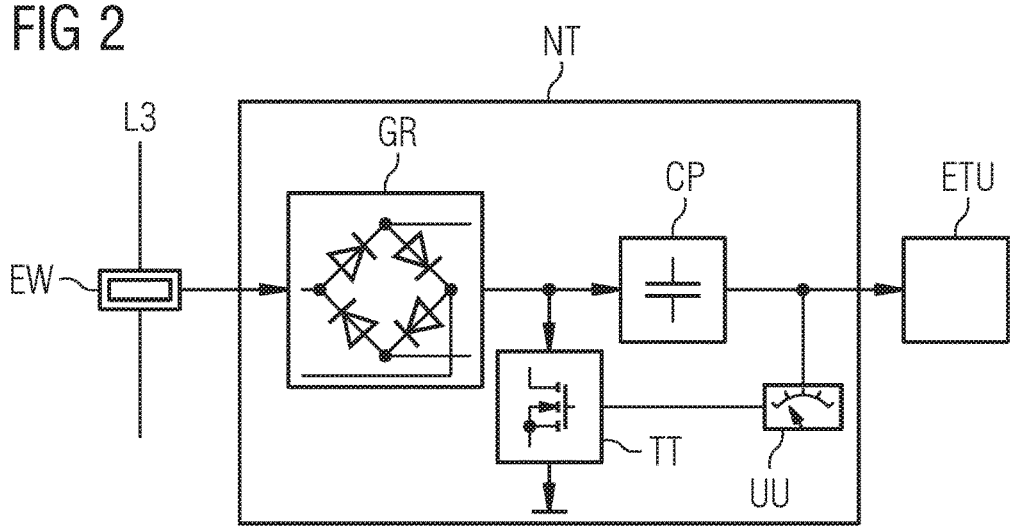
FIG. 2 shows a second illustration for explanation of an embodiment of the invention.

FIG. 2 shows an illustration of a part of FIG. 1, specifically the third conductor L3, the energy converter EW thereof, the power supply unit NT and the control unit ETU. In this case, the power supply unit NT is illustrated in more detail.

The power supply unit NT has a rectifier circuit GR, a buffer capacitor CP and a voltage limitation circuit SBS. The voltage limitation circuit SBS has a voltage monitoring system UU and a transistor or transistor circuit TT, which has, in particular, a short-circuiting transistor.

This power supply unit NT, which is also referred to as an inherent supply power unit of the circuit breaker or the control unit ETU, thus consists in simplified terms of the following units: rectifier circuit GR, buffer capacitor CP, voltage monitoring system UU of the buffer capacitor and short-circuiting transistor TT.

A flow of current in the conductor, for example the third conductor L3, induces a current in the energy converter EW, which current is fed on the secondary side to the rectifier GR, for example a bridge rectifier, and is rectified by the rectifier. The buffer capacitor CP buffers or stores this energy. The connected control unit ETU in turns draws energy from the buffer capacitor CP, that is to say discharges the buffer capacitor. The voltage level across the capacitor is in this case monitored via the voltage limitation circuit SBS, in particular the voltage monitoring system UU. When a specific upper threshold value of the voltage (upper voltage threshold value) is reached, the transistor TT, for example a power transistor, is actuated, which transistor shorts the output of the rectifier GR or can acquire a low resistance and thus prevents further charging of the buffer capacitor CP. The falling voltage across the buffer capacitor CP due to continuous energy withdrawal by the control unit ETU in turn leads to a lower threshold value of the voltage (lower voltage threshold value) being reached, which in turn results in blocking of the transistor TT, so that the buffer capacitor is charged again.

This control loop of the voltage limitation circuit SBS generates a pulsating charging current of the buffer capacitor depending on the amount of energy delivered by the energy converter EW and by way of the amount of energy taken by the control unit ETU.

Figure 3:
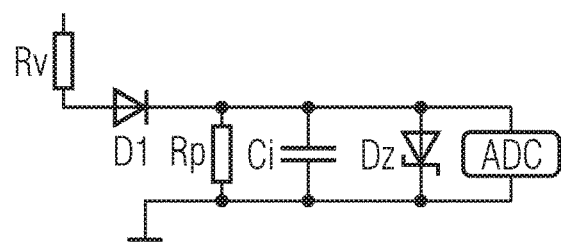
FIG. 3 shows a circuit diagram of a measurement circuit.

FIG. 3 shows a measurement circuit according to the invention. The measurement circuit has a series circuit of a first resistor Rv and a first diode D1 with a parallel circuit. In this case, the connections of the series circuit form the input connections of the measurement circuit; on one side the connection of the first resistor Rv forms the first input connection and on the other side the other connection of the parallel circuit forms the second input connection.

The parallel circuit has a second resistor Rp, a capacitor Ci and an analog-to-digital converter ADC. The parallel circuit can also have a second diode Dz, for example a Zener diode.

Not illustrated in FIG. 3 are the output connections of the analog-to-digital converters ADC, which are conventionally connected to the control unit ETU.

In one configuration, the analog-to-digital converter ADC can have a microprocessor, which can carry out preprocessing of the digital signal for the control unit ETU.

Figure 4:
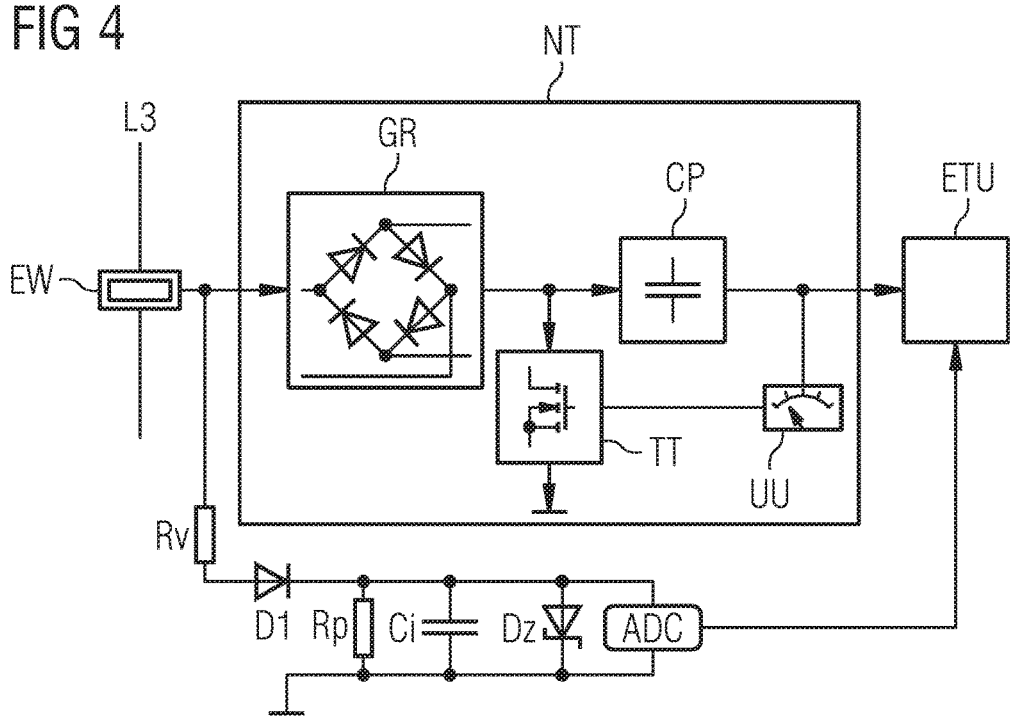
FIG. 4 shows a third illustration for explanation of an embodiment of the invention.

FIG. 4 shows an illustration in accordance with FIG. 2 with the difference that the measurement circuit in accordance with FIG. 3 has been integrated.

The input connection of the measurement circuit is connected to the energy converter EW so that the voltage or energy between the energy converter EW and the power supply unit NT, in particular the rectifier GR thereof, can be concomitantly detected by the measurement circuit.

The measurement circuit is connected on the output side to the control unit ETU.

Figure 5:
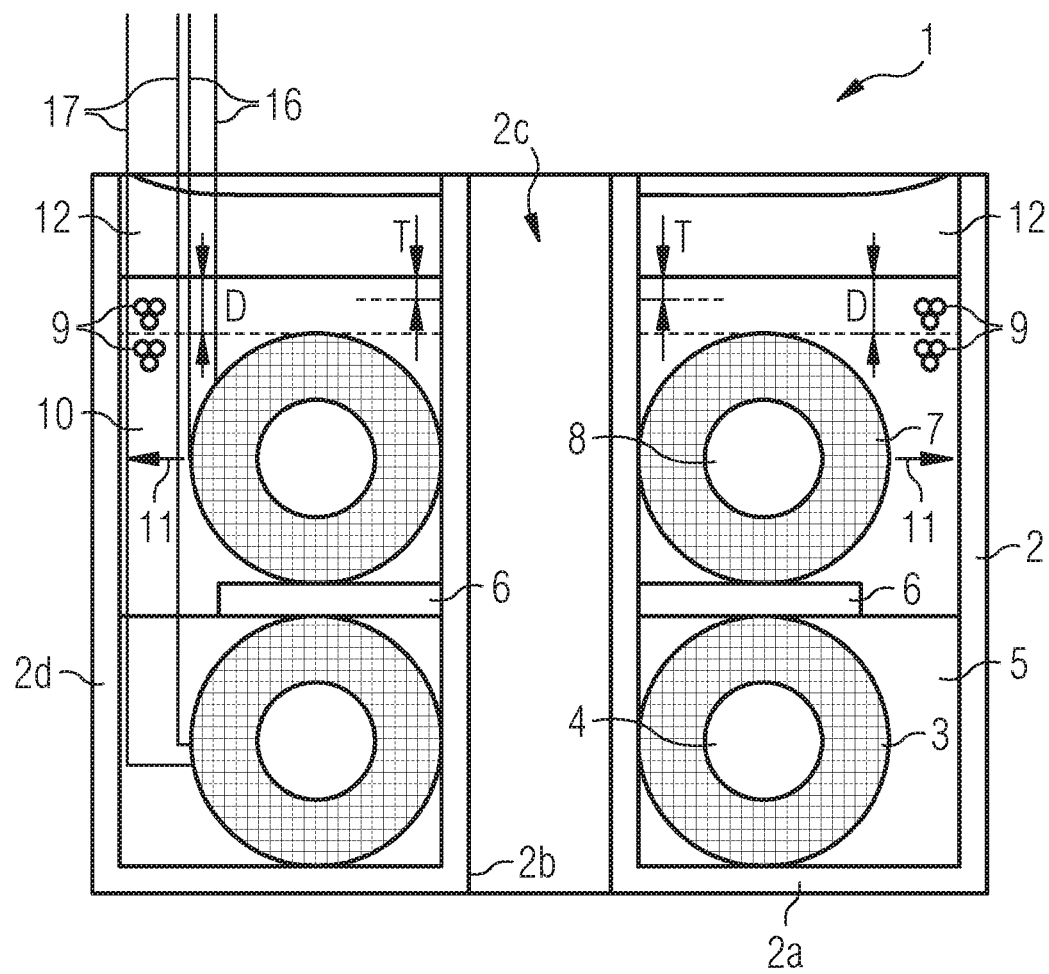
FIG. 5 shows an illustration of a combined converter.

FIG. 5 shows a schematic cross section through a converter unit 1, in particular a combination converter, for a circuit breaker LS—which is supplied with electrical energy by the converter unit 1 and with a signal for current measurement.

The converter unit 1 has a housing 2 with a pot shape, which housing is composed of an electrically insulating plastic. A hollow (passage) cylinder 2b (generally a passage channel 2c) is integrally formed on the housing floor 2a, a conductor, for example the third conductor L3, in the form of a primary conductor (primary winding) of the converter unit 1 running through the hollow (passage) cylinder. In this case, the plastic has, by way of example, an insulating capacity of approximately 20-30 kV/mm.

A (first) secondary winding 3 lies on the housing floor 2a, which (first) secondary winding is arranged concentrically in relation to the hollow cylinder 2b and is wound onto a nonmagnetic annular core 4, for example a Rogowski converter for measuring current. The secondary winding 3 is at least predominantly embedded in an electrically insulating solid plastic compound 5. It goes without saying that the secondary winding 3 may also be a simple annular coil that is wound around the annular core 4.

A flat spacer element 6 in the form of a perforated disk lies directly on top of the secondary winding 3 by way of its lower flat face, so that the secondary winding 3 is at least partially covered in a radial manner as seen from the top. There is no plastic compound 5 between the secondary winding 3 and the spacer element 6. In FIG. 5, the secondary winding 3 is completely covered in a radial manner as seen from the top.

A further (second) secondary winding 7, which is wound onto a core, in the example a magnetic annular core 8, for example made of nanocrystalline material (e.g. ferromagnetic core converter for supplying energy), lies on the top face of the spacer element 6. The spacer element 6 clearly defines the distance between the two secondary windings 3, 7. In this case, the magnetic annular core 8 is composed of soft magnetic material, such as ferromagnetic or nanocrystalline material. It goes without saying that the winding 7 may also be a simple annular coil that is wound around the annular core 8.

The secondary winding 7 is completely embedded in electrically insulating loose particles 9 above the spacer element 6. In FIG. 5, the winding 7 is also completely covered by particles 9 in the direction of the top; the cover or the particle layer 10 has a thickness D in this case. In principle, an embedding arrangement in the radial direction 11 is already sufficient. The particles 9 that bear against one another are only schematically illustrated (at the top right) in FIG. 5. In this case, the particles 9 fill the region next to and the region (with the thickness D) above the secondary winding 7.

The particles 9 are glass balls with a suitable diameter distribution (for example in the form of a Gaussian distribution in this case). As an alternative, the particles may also be ceramic powders or ceramic granules, in particular aluminum oxide ($Al_2O_3$) with an average particle size of 300 μm. Cured resin can also be pulverized, in principle.

In this case, the thickness D of the particle layer 10 amounts to several average particle diameters.

The region directly adjoining the particle layer 10 is encapsulated with an encapsulation compound 12. In this case, the encapsulation compound 12 bears firmly (intimately) against the inner face of the housing wall 2d and at least also against the particles 9 that lie at the top in the direction of the housing opening.

However, proceeding from the top face of the particle layer 10, the particles 9 in FIG. 5 are even embedded in the encapsulation compound 12 down to a depth T of several average particle diameters, wherein the depth T is less than the thickness D of the particle layer 10. In this case, the encapsulation compound 12 bears against the particles 9 (all the way around) virtually down to a depth T, not only in each case against the top face of the particles 9 that lie at the top (at the very top) in the direction of the housing opening.

An embodiment of the invention will be explained again in more detail below.

The supply of energy to a circuit breaker LS, in particular the control unit ETU thereof, is often based on obtaining energy from iron converters, which, together with the measurement converter in a housing as a so-called combined converter, are mounted on a busbar. The iron converter acts in this case like a current source that is proportional to the conductor current and is often limited by way of a compensation winding. The combined converter consisting of measurement and energy converters should usually be arranged in each phase L1, L2, L3 or each conductor (3 or 4 in a circuit breaker). The phases or conductors deliver measurement signals, the level of the electric current of the conductor and the required energy to the control unit ETU.

The supply of energy to the control unit ETU, a safety-critical component part for monitoring tasks in energy distribution installations, is extremely important to ensure correct functioning of the circuit breaker. For this reason, all of the constituent parts of the entire monitoring chain of the circuit breaker, from combined converters to the tripping mechanism, have to have their proper functionality checked regularly, even better continuously. An embodiment of the invention describes an arrangement and a method therefor that is aimed at monitoring the energy contribution of the individual energy converters during running operation. In this case, it is possible to use An embodiment of the invention not only to ascertain the correct function or the presence of an energy converter EW (qualitative statement) but also to quantitatively determine the amount of energy delivered by the energy converters to the control unit ETU or a load.

An embodiment of the invention proposes a measurement circuit or circuit arrangement that is used to integrate and measure a voltage that is proportional to the energy contribution delivered by the energy converter EW to the power supply unit NT, in particular the buffer capacitor CP, that is to say to the control unit ETU. Due to the described control process of the power supply unit NT, a pulsed current flows from the energy converters EW via the rectifier GR to the buffer capacitor CP.

The arrangement according to an embodiment of the invention has a voltage divider, formed from the first resistor Rv and second resistor Rp, a first diode D1 for preventing reverse flow and a capacitor Ci as integration element. The measurement circuit is connected in each phase L1, L2, L3 or conductor between the energy converter EW and the power supply unit NT or the rectifier GR thereof.

The voltage pulses of the power supply unit NT are integrated on the capacitor Ci by way of the high-resistance voltage divider. Back discharge of the capacitor Ci into the energy converter EW or the power supply unit NT is prevented by way of the first diode D1.

The capacitor Ci is substantially discharged by way of the second or parallel resistor Rp. The voltage pulses have a specific width and frequency depending on the primary current of the conductor and on the amount of energy required by the control unit ETU/drawn from the power supply unit NT.

The area of the pulses is proportional to the amount of energy. The pulsed voltage is integrated; at the same time, the capacitor Ci is discharged in the pulse pauses via the second or parallel resistor Rp. A specific voltage level is set via the capacitor Ci depending on the flowing primary current and the presently withdrawn amount of energy from the power supply unit, that is to say the control unit ETU.

The voltage level is detected with the aid of the analog-to-digital converter ADC and is fed to the control unit ETU. Level limitation for the analog-to-digital converter ADC, for example to 3.3 volts, is implemented with the aid of a second diode Dz, for example a Zener diode or series circuit of diodes.

In the control unit, the determined amount of energy is compared to the energy or the current determined by the sensor unit SE. The two amounts of energy or the levels of the current should normally correlate with the amount of energy in the measurement circuit, that is to say should be in a particular ratio with respect to one another. If the two amounts of energy differ from one another, the difference is thus determined, for example, and if this difference exceeds a first threshold value, a warning signal is emitted, which warning signal can be signaled, for example, at the circuit breaker, for example in the form of an optical or/and acoustic signal. The warning signal can also be transmitted in wired or in wireless fashion to another location.

A user is thus informed about a problem with the circuit breaker.

It is possible, owing to an embodiment of the proposed invention, to enable effective monitoring of the correct functioning of the individual energy converters of a circuit breaker in running operation in a simple and less costly manner. An essential advantage consists in being able to make a quantitative statement about the amount of energy delivered by the individual energy converters by way of the invention. The information can thus be used for or included in both the monitoring of the function of the converters and the energy management of the control unit ETU.

Although the invention has been described and illustrated in detail by way of the example embodiment, the invention is not restricted by the disclosed examples and other variations can be derived herefrom by a person skilled in the art without departing from the scope of protection of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A circuit breaker for interrupting an electrical circuit including electrical conductors, the circuit breaker comprising:
   an energy converter to supply energy to the circuit breaker, a primary side of the energy converter being formed by a conductor and a secondary side of the energy converter being connected to a power supply;

a sensor to determine a level of electric current of at least one of the electrical conductors of the electrical circuit; and a controller of the circuit breaker, connected to the power supply and the sensor, configured to cause an interruption of the electrical circuit in response to at least one of current limit values or current/time period limit values being exceeded, wherein the secondary side of the energy converter is connected to an input of a measurement circuit, an output of the energy converter being connected to the controller, wherein the measurement circuit is configured to determine an amount of energy and is configured to deliver the amount to the controller, and wherein the controller is configured to compare the amount of energy determined with the level of the electric current determined by the sensor and is configured to emit a warning signal in response to a first threshold value being exceeded.

2. The circuit breaker of claim 1, wherein the electrical circuit is a three-phase AC circuit.

3. The circuit breaker of claim 2, wherein the circuit breaker is a 3-pole or 4-pole circuit breaker.

4. The circuit breaker of claim 2, wherein one sensor, one energy converter and one measurement circuit is provided for each of the electrical conductors of the circuit breaker, and wherein the controller is configured to, for each of the electrical conductors of the circuit breaker, compare the amount of energy determined with the level of current determined and emit a warning signal in response to the first threshold value being exceeded.

5. The circuit breaker of claim 1, wherein the circuit breaker is a 3-pole or 4-pole circuit breaker.

6. The circuit breaker of claim 5, wherein one sensor, one energy converter and one measurement circuit is provided for each of the electrical conductors of the circuit breaker, and wherein the controller is configured to, for each of the electrical conductors of the circuit breaker, compare the amount of energy determined with the level of current determined and emit a warning signal in response to the first threshold value being exceeded.

7. The circuit breaker of claim 1, wherein one sensor, one energy converter and one measurement circuit is provided for each of the electrical conductors of the circuit breaker, and wherein the controller is configured to, for each of the electrical conductors of the circuit breaker, compare the amount of energy determined with the level of current determined and emit a warning signal in response to the first threshold value being exceeded.

8. The circuit breaker of claim 7, wherein the power supply includes a rectifier circuit, a voltage limitation circuit and a buffer capacitor.

9. The circuit breaker of claim 8, wherein the buffer capacitor is configured to provide the supply voltage for the control unit and is configured to provide an input voltage for the voltage limitation circuit.

10. The circuit breaker of claim 1, wherein the energy converter is an iron core converter or a converter with a nanocrystalline core.

11. The circuit breaker of claim 1, wherein the sensor includes a Rogowski coil.

12. The circuit breaker of claim 1, wherein the power supply includes a rectifier circuit, a voltage limitation circuit and a buffer capacitor.

13. The circuit breaker of claim 12, wherein the buffer capacitor is configured to provide the supply voltage for the control unit and is configured to provide an input voltage for the voltage limitation circuit.

14. The circuit breaker of claim 13, wherein the voltage limitation circuit includes at least one transistor.

15. The circuit breaker of claim 12, wherein the voltage limitation circuit includes at least one transistor, in particular a short-circuiting transistor.

16. The circuit breaker of claim 15, wherein the at least one transistor includes a short-circuiting transistor.

17. The circuit breaker of claim 1, wherein in the measurement circuit, the first input connection is connected to the second input connection via a series circuit of a first resistor, a first diode and a parallel circuit, wherein the parallel circuit includes a second resistor, a capacitor and an analog-to-digital converter, and wherein at least two output connections of the analog-to-digital converter are connected as output connections of the measurement circuit to the controller.

18. The circuit breaker of claim 17, wherein the parallel circuit includes a second diode.

19. The circuit breaker of claim 18, wherein the second diode is a Zener diode.

20. The circuit breaker of claim 17, wherein a microprocessor is connected downstream of the analog-to-digital converter.

21. The circuit breaker of claim 1, wherein the energy converter, and at least a part of the sensor, are arranged in a common housing.

22. A method for a circuit breaker including an energy converter to supply energy to the circuit breaker, a primary side of the energy converter being formed by a conductor, a secondary side of the energy converter being connected to an input of a measurement circuit, and an output of the energy converter being connected to a controller$_s$; the circuit breaker further including a sensor and the controller, connected to the sensor, the method comprising:

determining, via the measurement circuit connected on the secondary side of the energy converter, an amount of energy;

determining, via the sensor, electric current of at least one conductor passing through the circuit breaker;

comparing, via the controller, the amount of energy determined by the measurement circuit with a level of the electric current determined by the sensor; and emitting a warning signal upon the comparing yielding a difference exceeding a first threshold value.

23. The method of claim 22, wherein the determining of the amount of energy includes determining the amount of energy from an applied secondary voltage on the secondary side, by integration.

* * * * *